(12) United States Patent
Meyer

(10) Patent No.: US 11,445,309 B2
(45) Date of Patent: Sep. 13, 2022

(54) CABLE FOR A HEARING DEVICE

(71) Applicant: Sonova AG, Staefa (CH)

(72) Inventor: Jonas Meyer, Staefa (CH)

(73) Assignee: Sonova AG, Staefa (CH)

( * ) Notice: Subject to any disclaimer, the term of this patent is extended or adjusted under 35 U.S.C. 154(b) by 103 days.

(21) Appl. No.: 16/901,060

(22) Filed: Jun. 15, 2020

(65) Prior Publication Data

US 2020/0404436 A1    Dec. 24, 2020

(30) Foreign Application Priority Data

Jun. 24, 2019 (EP) .................................... 19181995

(51) Int. Cl.
| | | |
|---|---|---|
| H04R 25/00 | (2006.01) | |
| H01Q 1/27  | (2006.01) | |
| H05K 1/02  | (2006.01) | |
| H05K 1/11  | (2006.01) | |

(52) U.S. Cl.
CPC ............. *H04R 25/60* (2013.01); *H01Q 1/273* (2013.01); *H04R 25/556* (2013.01); *H04R 25/65* (2013.01); *H05K 1/028* (2013.01); *H05K 1/118* (2013.01); *H04R 2225/021* (2013.01); *H04R 2225/023* (2013.01); *H04R 2225/025* (2013.01); *H04R 2225/51* (2013.01)

(58) Field of Classification Search
CPC ...... H04R 25/60; H04R 25/556; H04R 25/65; H04R 2225/021; H04R 2225/023; H04R 2225/025; H04R 2225/51; H01Q 1/273; H01Q 1/46; H05K 1/028; H05K 1/118
See application file for complete search history.

(56) References Cited

U.S. PATENT DOCUMENTS

| | | | |
|---|---|---|---|
| 6,365,835 B1* | 4/2002 | Farmer ................. | H01B 7/365 |
| | | | 174/112 |
| 2010/0067725 A1* | 3/2010 | Schumaier .......... | H04R 25/456 |
| | | | 381/330 |
| 2012/0014549 A1 | 1/2012 | Higgins et al. | |
| 2017/0188163 A1 | 6/2017 | Rabel et al. | |
| 2018/0192211 A1* | 7/2018 | Møller ................ | H04R 25/607 |

FOREIGN PATENT DOCUMENTS

EP         2930951         10/2015

OTHER PUBLICATIONS

European Patent Office, Extended European Search Report and written opinion in application No. EP19181995.2, dated Jan. 13, 2020, 7 pages, Munich Germany.

* cited by examiner

*Primary Examiner* — Angelica M McKinney
(74) *Attorney, Agent, or Firm* — Marshall & Melhorn, LLC

(57) ABSTRACT

A cable for a hearing device is provided. The hearing device may have an in-the-canal part with a receiver and a behind-the-ear part with an electronic module. The cable may be adapted to connect the in-the-canal part and the behind-the-ear part. The cable may be a flexible printed circuit board having a plurality of conductor tracks. An end of the flexible printed circuit board is populated with at least one of a sensor, an LED and a push button.

13 Claims, 2 Drawing Sheets

CABLE FOR A HEARING DEVICE

TECHNICAL FIELD

The invention relates to a cable for a hearing device and to a hearing device comprising such a cable.

BACKGROUND OF THE INVENTION

Hearing devices, in particular for hearing impaired people, are known in the art. In so called Receiver-in-the-Canal (RIC) hearing devices, a speaker is placed within a hearing canal and connected by a cable to an on-the-ear component or behind-the-ear component. In the domain of hearing devices the speaker is referred to as receiver.

US 2012/0014549 A1 discloses methods and apparatus for hearing assistance devices, including connections for receiver-in-canal hearing devices. In various embodiments, a hearing device includes a hearing device component adapted to rest on or behind the ear and hearing assistance electronics disposed in the component. A first connector portion is disposed in the component, the first connector portion electrically connected to the hearing assistance electronics. A second connector portion is adapted to conform to a portion of the component and to electrically and physically connect a cable to the first connector portion. In various embodiments, at least one of the first connector portion and the second connector portion employ scratch pads for contacts. The first connector portion is top loading, in an embodiment.

US 2018/192211 A1 discloses an assembly for a hearing aid. The hearing aid with the assembly composes an in the ear part and a behind the ear part and a part mechanically interconnecting the two parts. In the interconnection, a flexible substrate is arranged The flexible substrate comprises conductive paths. The conductive paths may be used for communication between the in the ear part and the behind the ear part, and/or for an antenna function.

US 2017/188163 A1 discloses wireless communication antennas for hearing assistance devices. In various embodiments, a hearing assistance device includes a housing configured to be worn on or behind the ear, hearing assistance electronics enclosed in the housing, an ear mold configured to be worn in the ear, a sound tube configured to connect to the earmold and to transmit an acoustic output to the earmold, and an earhook configured to connect the housing to the sound tube. At least one of the earmold, the sound tube, and the earhook includes a conductive polymer forming at least a portion of an antenna for wireless communication, in various embodiments.

EP 2 930 951 A1 discloses a method, comprising using a cable assembly to connect hearing assistance electronics in a first housing to an acoustic transducer in a second housing, the acoustic transducer configured to emit or receive sounds, the cable assembly including a first conductor configured to transmit signals between the hearing assistance electronics and the acoustic transducer and a second dedicated conductor configured to form an antenna for wireless communication, the antenna connected to a wireless communication transceiver.

There remains a need for an improved cable for a hearing device.

SUMMARY OF THE INVENTION

It is an object of the present invention to provide an improved cable for a hearing device.

The object is achieved by a cable for a hearing device according to claim 1.

Preferred embodiments of the invention are given in the dependent claims.

According to the invention, a cable for a hearing device is provided, the hearing device comprising an in-the-canal part with a receiver and a behind-the-ear part with an electronic module, wherein the cable is adapted to connect the in-the-canal part and the behind-the-ear part, wherein the cable is configured as or comprises a flexible printed circuit board (PCB) having a plurality of conductor tracks. An end of the flexible printed circuit board is populated with at least one of a sensor, an LED and a push button.

Other than with conventional receiver-in-the-canal hearing devices which use litz wire to electrically connect the in-the-canal part to the behind-the-ear part, the present invention provides a flexible printed circuit board to achieve this. The solution according to the invention allows for adding more functionality to the in-the-canal part. For example, it may be desirable to include one or more sensor, e.g. for health monitoring, in the in-the-canal part. The cable according to the invention allows for providing a sufficient number of individual electrical connections in the form of conductor tracks to connect both the receiver and any additional component, e.g. sensors. The additional component may be one or more of a motion sensor, a photo detector, a capacitor and a resistor.

While providing the same number or a greater number of individual electrical connections, a flexible PCB can be smaller and less visible than a cable having litz wires. A flex PCB may be populated at the end with the receiver and additional components while the litz wire has to be soldered to a PCB having these components so with the flexible PCB a soldering step may be omitted and space may be saved in the spot of the in-the-canal part where the litz wire does not have to be soldered any more. In particular for low power connections the cross section of the electrical connectors can be much lower than what is technically feasible with a litz wire so a lot more individual electrical connectors can be packed into a flexible PCB than with litz wire per square mm cross section.

In an exemplary embodiment, the cable comprises an electrical insulation formed by one of
cable extrusion,
embedding in a cast and
encapsulating within at least two plastic parts which are connected to each other by gluing or ultrasonic welding.

In an exemplary embodiment, an end of the flexible printed circuit board is populated with at least one electronic component, in particular at least one of a receiver, a sensor, an LED, a capacitor, a resistor and a push button.

In an exemplary embodiment, an end of the cable is configured to connect to a connector comprised in an electronic module for connecting a sound delivery system. This may be a so called SDS (sound delivery system) connector.

In an exemplary embodiment, the cable further comprises a serial number. The serial number may be applied on the flexible PCB, e.g. by a laser. The serial number may allow for linking the flexible PCB and any components thereon to a data base comprising measurement protocols or other information. This may be useful in case of repair or guarantee.

In an exemplary embodiment, the electrical insulation is integrally formed with at least one pull relief at at least one end of the flexible printed circuit board, the pull relief being configured to be mechanically fixed to an in-the-canal part or to an on-the-ear part or a behind-the-ear part of a receiver-in-the canal hearing aid. This allows for mechanically fixing the cable to the said part.

In an exemplary embodiment, a plastically deformable wire is embedded in the insulation. In an alternative embodiment, the PCB may be plated so as to be plastically deformable. This allows for individually bending the cable to bring it into a desired shape in which it remains to adapt it to the preferences and conditions of a particular user.

In an exemplary embodiment, the conductor tracks are disposed on two opposing outer surfaces of the flexible printed circuit board.

In an exemplary embodiment, the flexible printed circuit board is configured as a multi-layer flexible printed circuit board having two external layers and at least one internal layer, wherein one or more of the conductor tracks are disposed on the at least one internal layer. This allows for packing even more electrical connections into the cable.

In an exemplary embodiment, the cable has at least six or at least eight conductor tracks. Any other number of conductor tracks, in particular less than six, seven, or more than eight, is possible.

In an exemplary embodiment, an arrangement is provided, comprising an in-the-canal part for a receiver-in-the canal hearing device and a cable as described above, connected to the-in-the-canal part.

In an exemplary embodiment, a hearing device is provided, comprising an arrangement according as described above and a behind-the-ear part.

In an exemplary embodiment, a cable as described above may be used in a receiver-in-the canal hearing device to connect an in-the-canal part to an on-the-ear part or to a behind-the-ear part.

In an exemplary embodiment, at least one of the conductor tracks is used as an antenna.

In an exemplary embodiment, the hearing device is a hearing aid.

The invention is beneficial for hearing devices which are hearing aids. Hearing aids are worn by hearing disabled people. These people need to wear the hearing aid during a long time during the day and profit from the mechanical advantages and the possibility to enhance functionality of the device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

Corresponding parts are marked with the same reference symbols in all figures.

DETAILED DESCRIPTION OF PREFERRED EMBODIMENTS

Figure 1:
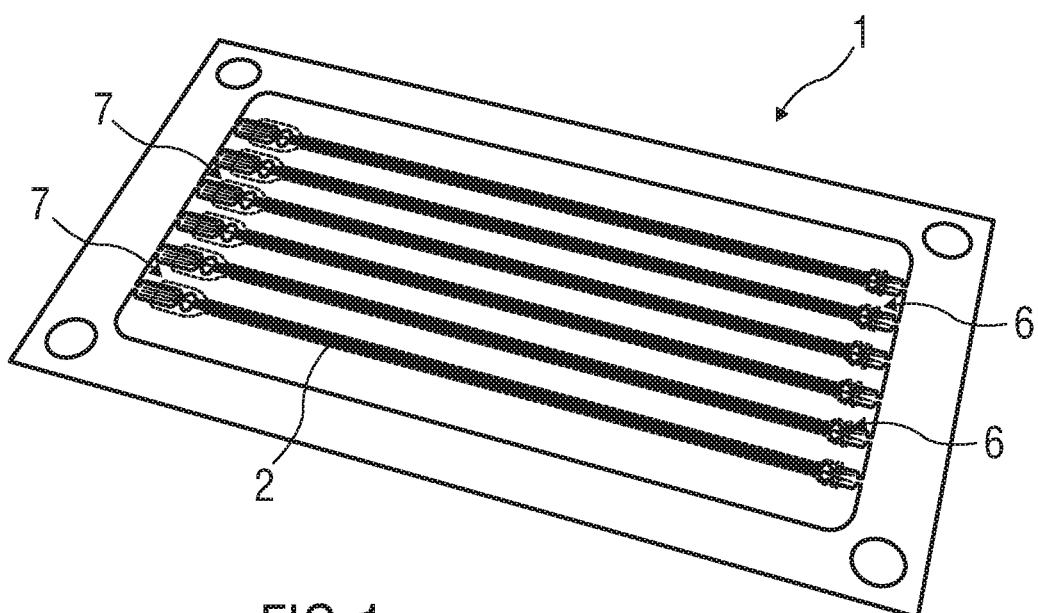
FIG. 1 is a schematic view of a PCB carrier carrying a number of cables.
Figure 2:
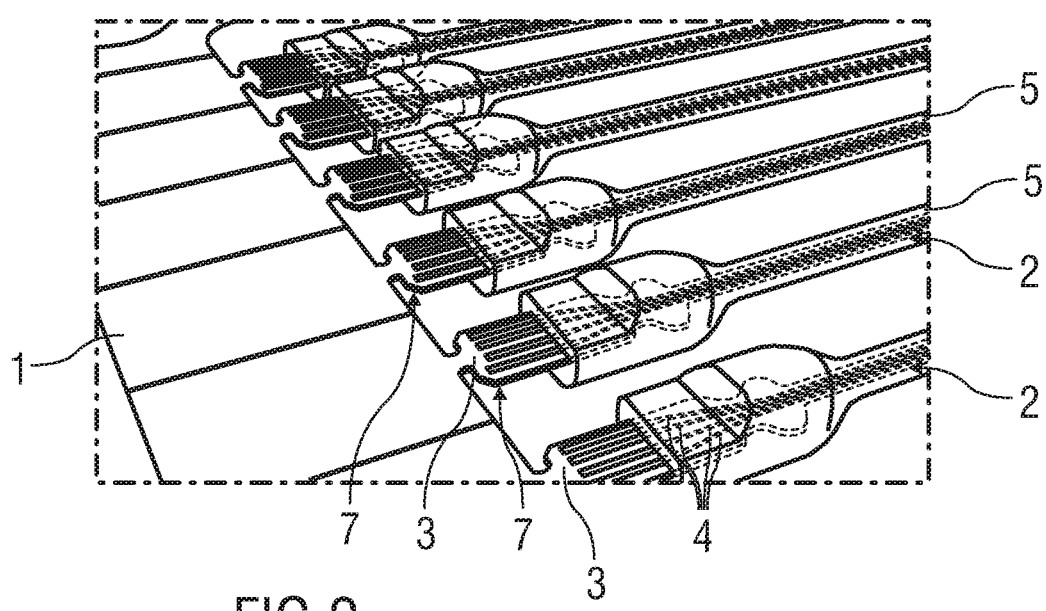
FIG. 2 is a schematic detail view of the PCB carrier.
Figure 3:
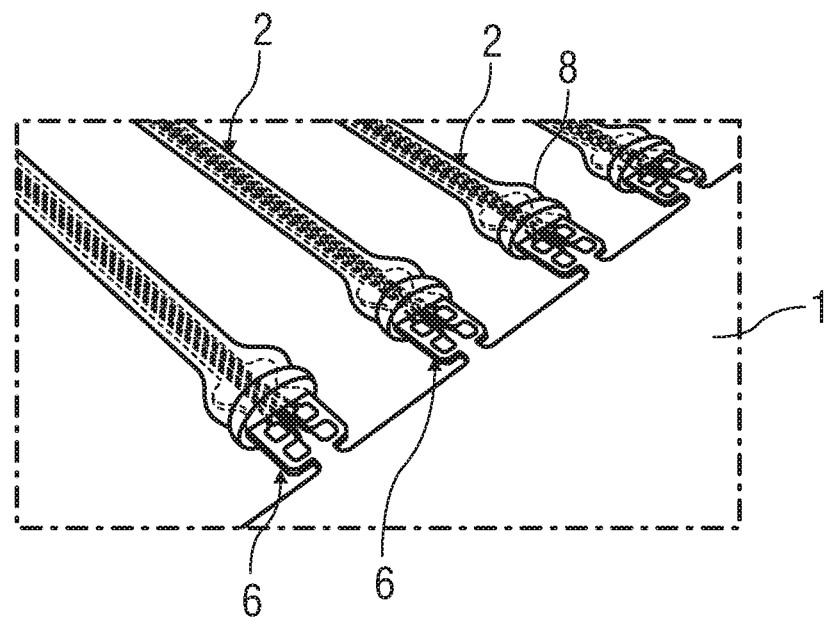
FIG. 3 is another schematic detail view of the PCB carrier.
Figure 4:
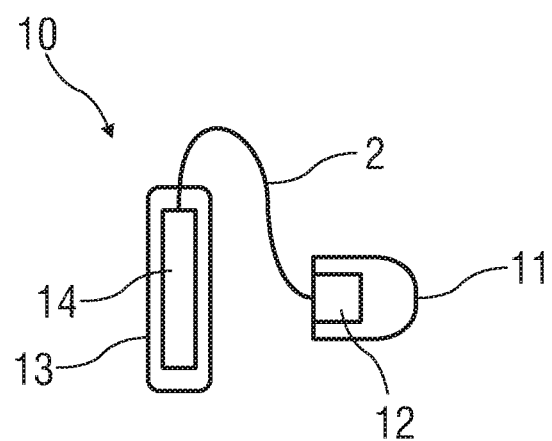
FIG. 4 is a schematic view of a hearing device comprising the cable.

FIG. 1 is a schematic view of a PCB carrier 1 carrying a number of cables 2. FIGS. 2 and 3 are schematic detail views of the PCB carrier 1. FIG. 4 is a schematic view of a hearing device 10 comprising a cable 2.

Each cable 2 comprises a flexible printed circuit board 3 having a plurality of conductor tracks 4. In a process of producing the cables 2, the flexible printed circuit boards 3 may have been part of the PCB carrier 1 from which they may have been cut free. The conductor tracks 4 may be produced by a photolithographic process and etching from a plating on a surface of the PCB carrier 1 or they may be produced by laminating or plating.

Each cable 2 may be configured to be used for a hearing device 10, the hearing device 10 comprising an in-the-canal part 11 with a receiver 12 and a behind-the-ear part 13 with an electronic module 14, wherein the cable 2 is adapted to connect the in-the-canal part 11 and the behind-the-ear part 13 or an on-the-ear-part (not shown) instead of the behind-the-ear-part 13.

The cable 2 may comprise an electrical insulation 5 enclosing the flexible printed circuit board 3 except for its ends 6, 7, formed by one of
  cable extrusion,
  embedding in a cast and
  encapsulating within at least two plastic parts which are connected to each other by gluing or ultrasonic welding.

An end 6 of the flexible printed circuit board 3 may be populated with at least one electronic component, in particular at least one of the receiver 12, a sensor, an LED, a capacitor, a resistor and a push button.

In an exemplary embodiment, the end 7 of the cable 2 is configured to connect to a connector comprised in the electronic module 14 for connecting a sound delivery system.

In an exemplary embodiment, the cable 2 may comprise a serial number (not shown).

The electrical insulation 5 is integrally formed with at least one pull relief 8 at at least one of the ends end 6, 7 of the flexible printed circuit board 3, the pull relief 8 being configured to be mechanically fixed to an in-the-canal part 11 or to an on-the-ear part or a behind-the-ear part 13 of a receiver-in-the canal hearing device 10.

In an exemplary embodiment, a plastically deformable wire (not shown) may be embedded in the electrical insulation 5. In an alternative embodiment, the flexible printed circuit board 3 may be plated so as to be plastically deformable. This allows for individually bending the cable 2 to bring it into a desired shape in which it remains to adapt it to the preferences and conditions of a particular user.

In an exemplary embodiment the conductor tracks 4 are disposed on two opposing outer surfaces of the flexible printed circuit board 3.

In an exemplary embodiment, the flexible printed circuit board 3 is configured as a multi layer flexible printed circuit board having two external layers and at least one internal layer, wherein one or more of the conductor tracks 4 are disposed on the at least one internal layer (not shown).

In an exemplary embodiment the cable 2 may have at least six or at least eight conductor tracks 4.

The cable 2 may be part of an arrangement, comprising an in-the-canal part 11 for a receiver-in-the canal hearing device 10. The cable 2 may be connected to the-in-the-canal part 11.

The arrangement may be part of a hearing device 10 also having a behind-the-ear part 13.

In an exemplary embodiment, at least one of the conductor tracks 4 may be used as an antenna.

In an exemplary embodiment, the hearing device 10 may be a hearing aid.

LIST OF REFERENCES

1 PCB carrier
2 cable
3 printed circuit board, PCB
4 conductor track
5 electrical insulation
6 end
7 end
8 pull relief
10 hearing device
11 in-the-canal part
12 receiver
13 behind-the-ear-part
14 electronic module

The invention claimed is:

1. A cable for a hearing device, the hearing device comprising an in-the-canal part with a receiver and a behind-the-ear part with an electronic module, wherein the cable is adapted to connect the in-the-canal part and the behind-the-ear part, wherein the cable is configured as or comprises a flexible printed circuit board having a plurality of conductor tracks, wherein an end of the flexible printed circuit board is populated with at least one of a sensor, an LED and a push button,
    wherein said cable comprises an electrical insulation formed by one of
        cable extrusion,
        embedding in a cast and
        encapsulating within at least two plastic parts which are connected to each other by gluing or ultrasonic welding,
    wherein a plastically deformable wire is embedded in the insulation,
    wherein the electrical insulation is integrally formed with at least one pull relief at at least one end of the flexible printed circuit board, the pull relief being configured to be mechanically fixed to the in-the-canal part or the behind-the-ear part.

2. The cable of claim 1, wherein the end of the flexible printed circuit board is populated with the receiver.

3. The cable according to claim 1, wherein an end of the cable is configured to connect to a connector comprised in the electronic module for connecting a sound delivery system.

4. The cable according to claim 1, further comprising a serial number.

5. The cable according to claim 1, wherein the conductor tracks are disposed on two opposing outer surfaces of the flexible printed circuit board.

6. The cable according to claim 1, wherein the flexible printed circuit board is configured as a multi-layer flexible printed circuit board having two external layers and at least one internal layer, wherein one or more of the conductor tracks are disposed on the at least one internal layer.

7. The cable according to claim 1, having at least six or at least eight conductor tracks.

8. The cable according to claim 1, wherein said cable is in said receiver to connect said in-the-canal part to the behind-the-ear part.

9. The cable according to claim 1, wherein at least one of the conductor tracks is used as an antenna.

10. The hearing device according to claim 1, wherein the at least one pull relief is uniformly distributed entirely about the cable.

11. The hearing device according to claim 10, the at least one pull relief forms an oval shape as it extends about the cable.

12. A hearing device, comprising:
    an in-the-canal part,
    a behind-the-ear part,
    a receiver, and
    a cable connected to the-in-the-canal part and adapted to connect the in-the-canal part and the behind-the-ear part, wherein the cable is configured as or comprises a flexible printed circuit board having a plurality of conductor tracks, wherein an end of the flexible printed circuit board is populated with at least one of a sensor, an LED and a push button,
    wherein said cable comprises an electrical insulation formed by one of
        cable extrusion,
        embedding in a cast and
        encapsulating within at least two plastic parts which are connected to each other by gluing or ultrasonic welding,
        wherein a plastically deformable wire is embedded in the insulation, wherein the electrical insulation is integrally formed with at least one pull relief at at least one end of the flexible printed circuit board, the pull relief being configured to be mechanically fixed to the in-the-canal part or the behind-the-ear part.

13. The hearing device according to claim 12, wherein the hearing device is a hearing aid.

* * * * *